United States Patent [19]

Cranston, III et al.

[11] Patent Number: 5,708,563
[45] Date of Patent: Jan. 13, 1998

[54] COMPUTER WITH MODULAR REMOVABLE CARD CAGE

[75] Inventors: William Vincent Cranston, III; Robert Allen Hood; Frederick Charles Yentz, all of Boca Raton; Jose Platon Basco, West Palm Beach, all of Fla.

[73] Assignee: International Business Machines Corporation, Armonk, N.Y.

[21] Appl. No.: 683,346

[22] Filed: Jul. 18, 1996

Related U.S. Application Data

[63] Continuation of Ser. No. 273,516, Jul. 11, 1994.
[51] Int. Cl.⁶ ...................................................... H05K 7/00
[52] U.S. Cl. ...................... 361/683; 361/686; 361/725; 361/726; 361/727; 361/784; 361/790; 361/796; 361/801; 361/802; 364/700.1; 439/61
[58] Field of Search ........................... 361/683, 725–727, 361/686, 685, 684, 784, 785, 788, 790, 796, 801, 802, 803; 364/708.1; 439/59, 61, 65

[56] References Cited

U.S. PATENT DOCUMENTS

| | | | |
|---|---|---|---|
| 4,084,250 | 4/1978 | Albertine et al. | 364/708 |
| 4,179,724 | 12/1979 | Bohhomme | 361/391 |
| 4,232,356 | 11/1980 | Saunders et al. | 361/415 |
| 4,860,163 | 8/1989 | Sarath | 361/384 |
| 4,964,017 | 10/1990 | Jindrick et al. | 361/390 |
| 5,428,535 | 6/1995 | Katsumata et al. | 364/424.05 |

FOREIGN PATENT DOCUMENTS

| | | |
|---|---|---|
| 0528168 | 2/1993 | European Pat. Off. . |
| 95-30-4389 | 11/1995 | European Pat. Off. . |
| 9108548 | 8/1991 | Germany . |
| 9112810 | 11/1991 | Germany . |
| 9311225 | 3/1994 | Germany . |
| 1594722 | 9/1990 | U.S.S.R. . |

Primary Examiner—Leo P. Picard
Assistant Examiner—Phuong T. Vu
Attorney, Agent, or Firm—Richard A. Tomlin; Andrew J. Dillon

[57] ABSTRACT

A computer includes a main enclosure for housing a plurality of computer components. A subenclosure or card cage for housing a planar circuit board, including a CPU, and at least one accessory board may be removably secured within the main enclosure, wherein the subenclosure, planar circuit board, and accessory circuit board may be selectively removed from the main enclosure as a unit. A connection device is provided to releasably electrically connect at least the planar circuit board to one of the computer components housed within the main enclosure.

6 Claims, 5 Drawing Sheets

COMPUTER WITH MODULAR REMOVABLE CARD CAGE

This is a continuation of application Ser. No. 08/273,516, filed Jul. 11, 1994.

BACKGROUND OF THE INVENTION

1. Technical Field

The present invention relates in general to computer hardware systems, and in particular to such computers utilized in industrial applications. Still more particularly, the present invention relates to the modular construction of such computers, wherein the computer system is more easily serviced and/or upgraded.

2. Description of the Related Art

Typical computer systems comprise a housing or enclosure that contains the individual components of the computer system, which may include a motherboard or planar circuit board that includes the central processing unit (CPU), I/O circuit boards, DASD, power supply, disk drives, and cables interconnecting these components. Generally, each of these components is individually removable from within the housing for repair or replacement.

One or more accessory circuit boards or cards are provided within the housing to expand or modify the input and output (I/O) capabilities of the computer system. Because it is expected that these accessory cards will be removed for repair or replacement rather frequently, the accessory cards are grouped in a subenclosure within the housing commonly known as a "card cage." The card cage generally is designed to group the accessory cards together for easy access and to provide mechanical and electrical connections to facilitate the installation and removal of the accessory cards.

U.S. Pat. No. 4,964,017, Oct. 16, 1990 to Jindrick et al. discloses a housing for a computer system that includes a card cage as described above. In one embodiment, the card cage, and accessory cards therein, are electrically connected to a motherboard or planar circuit board mounted on the floor of the main housing or enclosure or the computer system. Alternatively, the card cage and accessory cards therein, may be electrically connected to a passive backplane circuit board, which contains no active electrical components. The passive backplane circuit board is, in turn, electrically connected to one or more circuit boards, which include at least the CPU circuit board, the memory circuit board, and I/O circuit boards. It appears that the card cage disclosed by Jindrick may be removable from the remainder of the computer housing to facilitate access to the card cage and the various accessory cards contained therein.

The computer system disclosed by Jindrick is typical of industrial computer systems, which achieve flexibility in configuration and ease of repair by employing the passive backplane circuit board as a central connection member to which other components making up the computer are connected. However, the bulk of development in computer technology is occurring in the more commercial personal computer (PC) arena, in which the motherboard or planar circuit board, which contains all of the basic elements of the computer system (e.g. CPU, memory, and I/O controller), is the central "building block" of the computer system. Thus, advances in technology generally are first made available on a commercial basis in the form of motherboards or planar circuit boards incorporating these advances. Prior-art computer systems, like that disclosed by Jindrick, are not configured to take advantage of commercially avialable technological advances embodied in motherboards or planar circuit boards.

As advances are made in CPU and support technologies, it becomes advantageous to upgrade existing computer systems to take advantage of the processing power provided by these advances. Changes in CPU and support technologies often necessitate replacement of the mother board or planar circuit board along with the CPU. Additionally, differences in the architecture of the CPU and its associated planar circuit board may require changes in the I/O capabilities of the computer system, necessitating replacement of the previously mentioned accessory cards.

Because the planar circuit board and accessory circuit boards or cards are among the components most likely to require replacement or repair, a need exists for an improved computer system and card cage containing both the planar circuit board that includes a CPU, and at least one accessory circuit board, wherein the card cage, planar circuit board, and accessory circuit boards can be removed together as a unit from the housing of the computer system for replacement or repair.

SUMMARY OF THE INVENTION

It is a general object of the present invention to provide an improved computer of modular construction.

It is yet another object of the present invention to provide an improved computer system for utilization in industrial applications in which the planar circuit board and at least one accessory circuit board are removable as a unit from the computer system to facilitate replacement and repair of the planar circuit board and/or accessory circuit boards.

It is still another object of the present invention to provide a card cage assembly for utilization in a computer enclosure containing a plurality of computer components, wherein the card cage and associated components may be removed from the computer enclosure as a unit.

These and other objects of the present invention are accomplished by providing a computer including a main enclosure for housing a plurality of computer components. A subenclosure or card cage for housing a planar circuit board, including a CPU means, and at least one accessory board is removably secured within the main enclosure, wherein the subenclosure, planar circuit board, and accessory circuit board may be selectively removed from the main enclosure as a unit. A connection means is provided to releasably electrically connect at least the planar circuit board to one of the computer components housed within the main enclosure.

According to a preferred embodiment of the present invention, the subenclosure is a card cage having a substantially flat floor member and at least one upstanding wall. An external connection means is carried by the upstanding wall of the card cage for electrically connecting the accessory circuit board with apparatus external to the main enclosure.

According to a preferred embodiment of the present invention, the card cage is secured in the computer enclosure by at least one rail carried by the computer enclosure or the card cage and at least one groove formed in the other of the computer enclosure or card cage, wherein engagement of the rail with the groove removably secures the card cage within the computer enclosure. A fastening means is provided to selectively prevent movement of the card cage relative to the computer enclosure.

DETAILED DESCRIPTION OF PREFERRED EMBODIMENT

Figure 1:
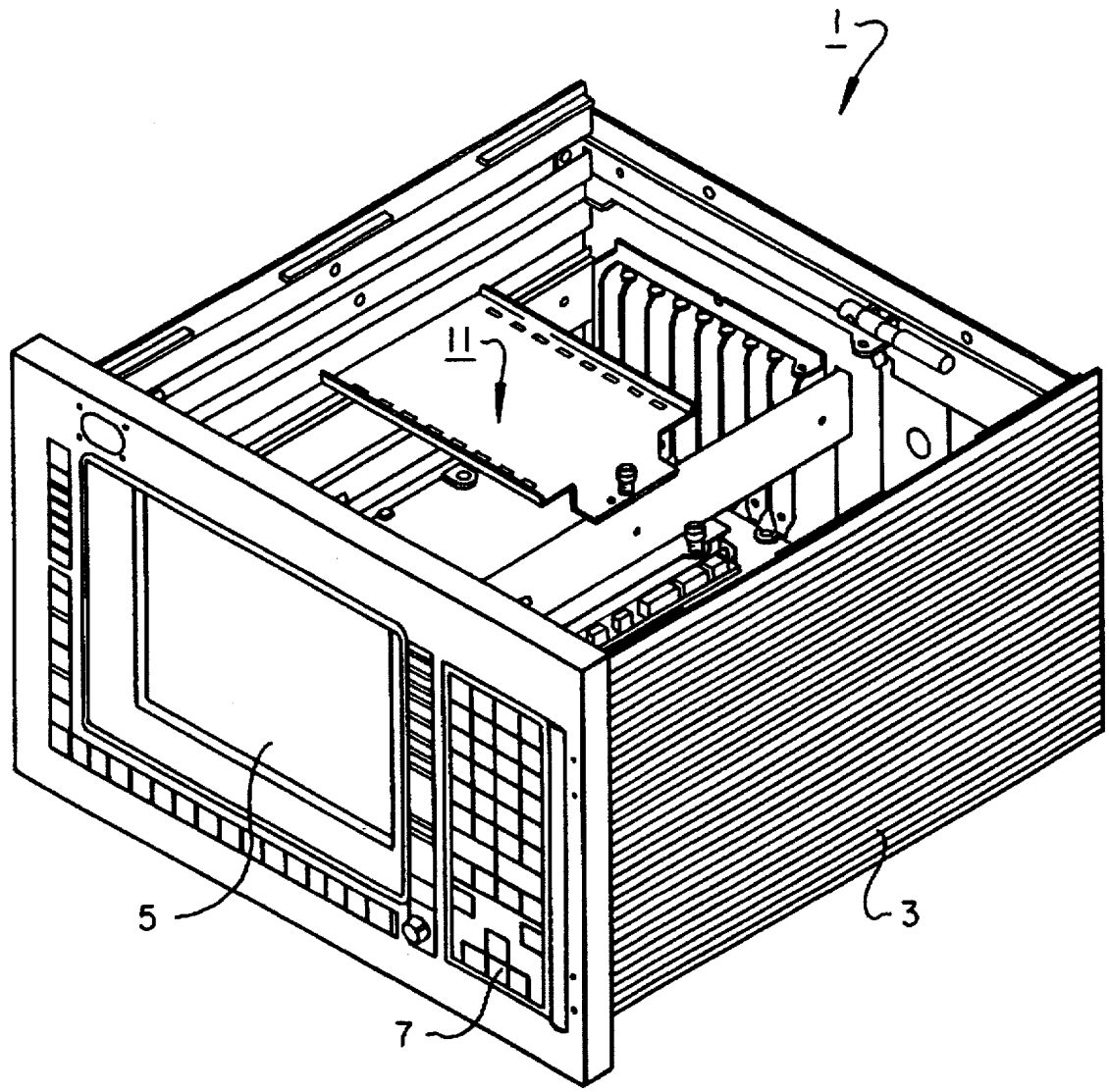
FIG. 1 is an isometric view of a computer according to the present invention.

Referring now to the Figures, and specifically to FIG. 1, an isometric view of a computer 1 according to the present invention is illustrated. Computer 1 is illustrated with its uppermost panel or cover removed. Computer 1 comprises a main enclosure or housing 3, which preferably includes a substantially flat base member (obscured from view in FIG. 1) and a pair of opposing upstanding sidewalls extending upwardly from the periphery of the base member. Main enclosure 3 houses various components of computer 1, for example a display panel 5 and a keyboard or similar input means 7, as well as other computer components. A subenclosure or card cage 11 is disposed within main enclosure 3. As will be described in greater detail below, subenclosure or card cage 11 is provided to house a planar circuit board that includes a central processing unit (CPU) and various accessory circuit boards.

Figure 2:
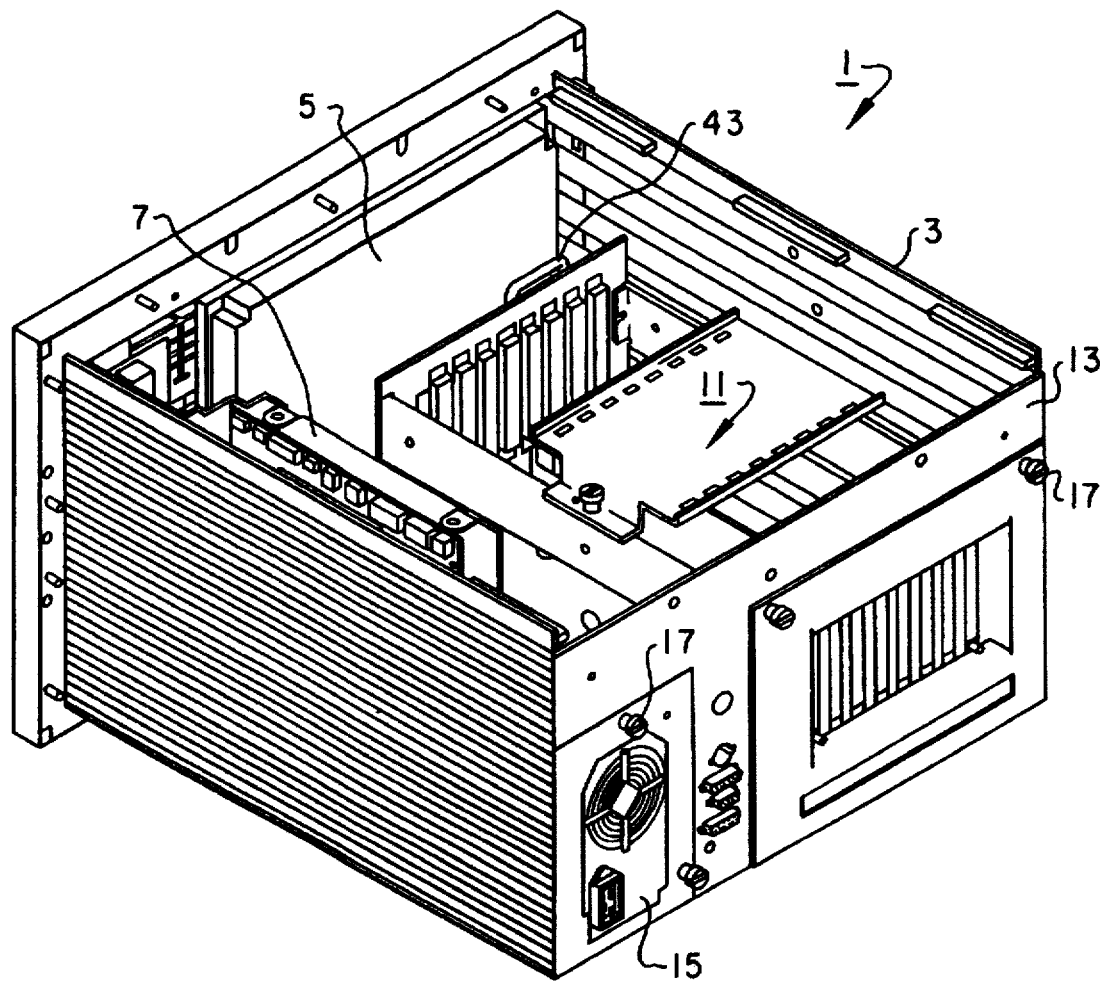
FIG. 2 is a rear isometric view of the computer illustrated in FIG. 1.
Figure 3:
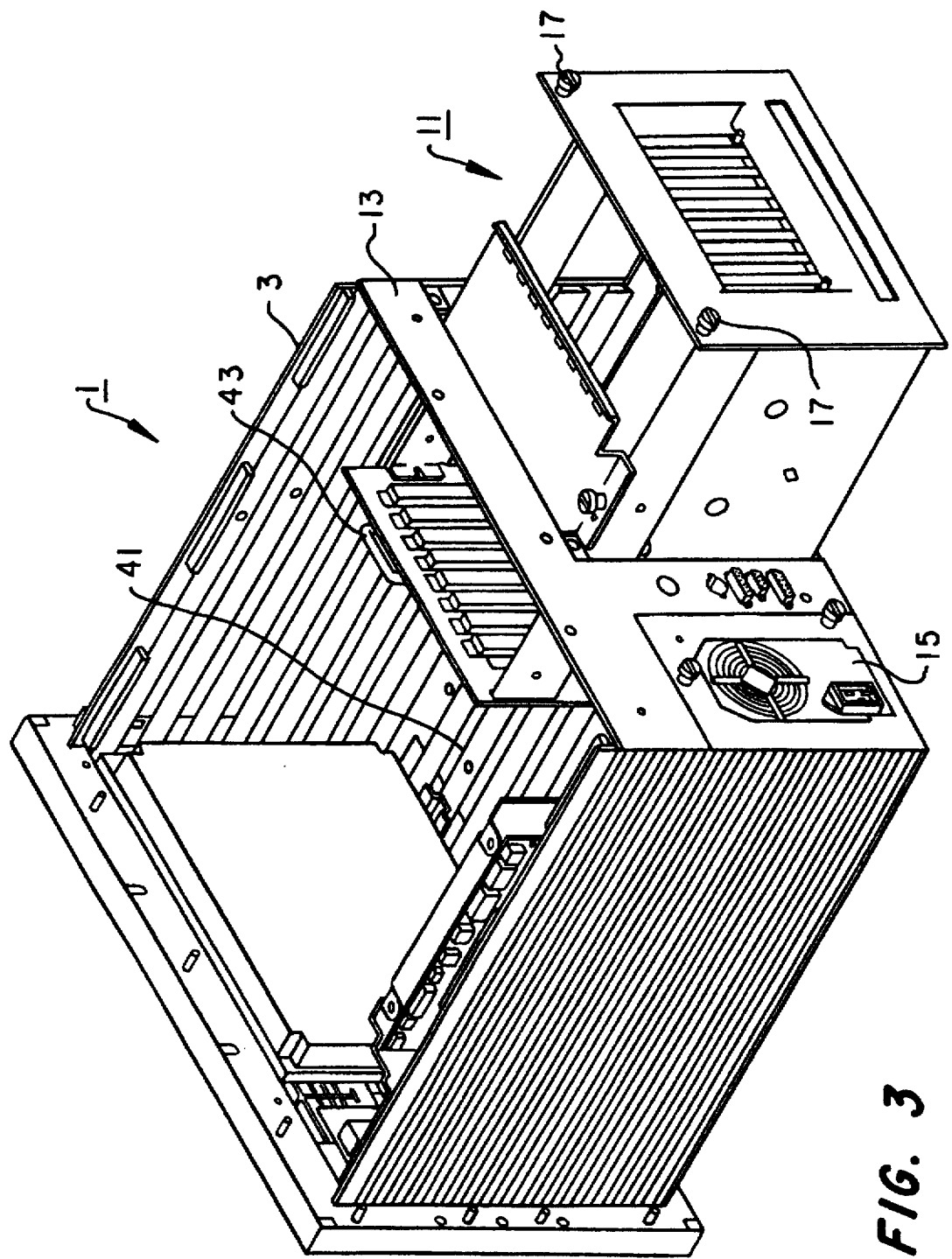
FIG. 3 is a rear isometric view similar to that depicted in FIG. 2 illustrating the removal of the card cage or subenclosure according the present invention.

FIGS. 2 and 3 depict rear isometric views of computer 1 illustrated in FIG. 1. As illustrated, a rear panel 13 is secured to main enclosure 3 and is provided with openings through which computer components and associated equipment, such as card cage 11 and power supply 15 can be removed selectively from main enclosure 3. FIG. 3 depicts the removal of subenclosure or card cage 11 from main enclosure. A pair of thumb screws 17 are provided on a rear portion of subenclosure or card cage 11 and mate with corresponding threaded apertures on rear panel 13 of main enclosure 3 to secure subenclosure or card cage 11 against movement relative to main enclosure 3. A similar arrangement is provided for the selective removal of power supply 15.

Figure 4:
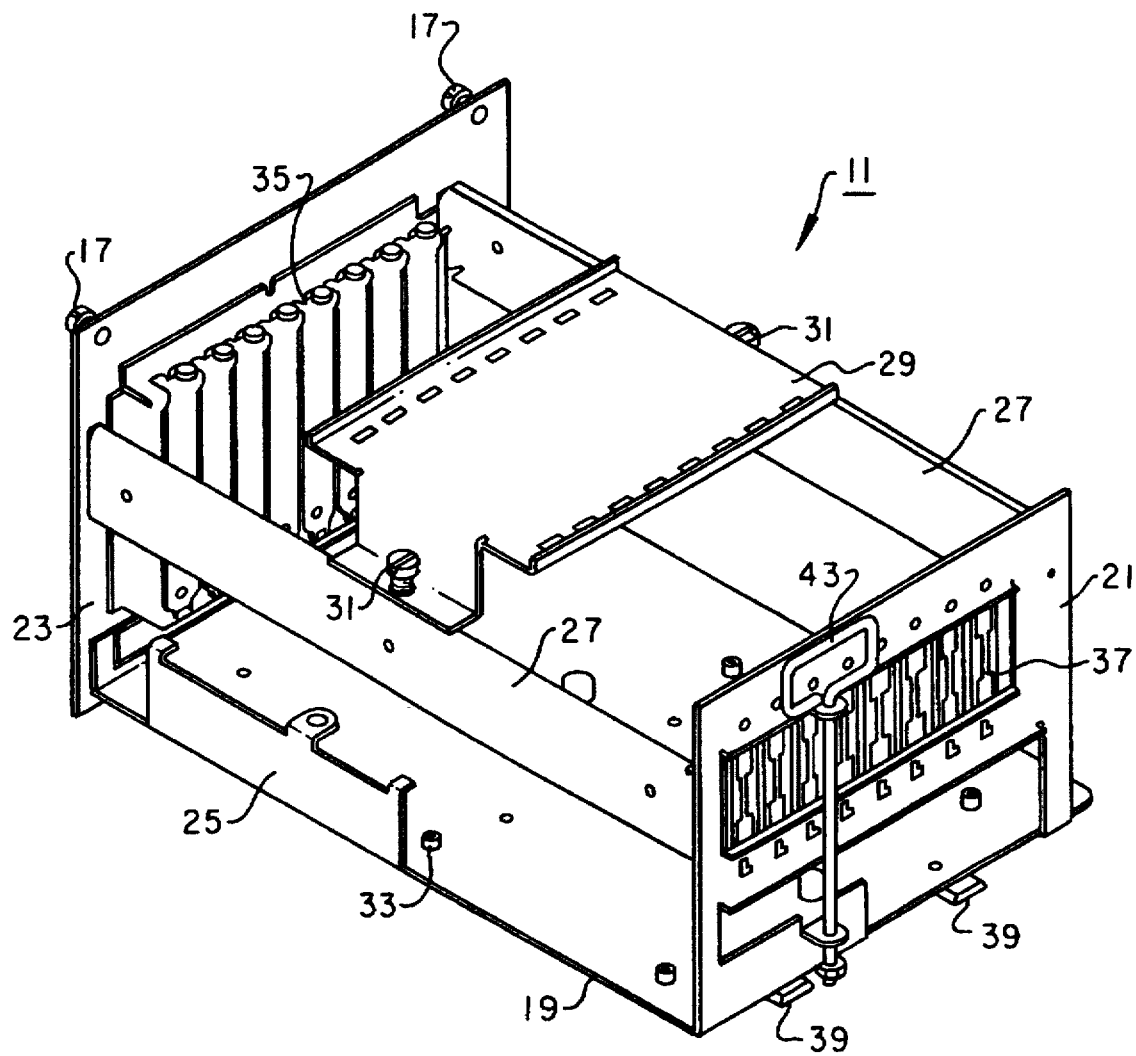
FIG. 4 is an isometric view of the card cage or subenclosure according the present invention.

FIG. 4 is an isometric view of subenclosure or card cage 11 according to the present invention, illustrated without the planar circuit board and accessory circuit boards disposed therein. Card cage 11 includes a substantially flat base member 19, which is bent upward at its forward end to provide a front upstanding wall or panel 21. A rear upstanding panel 23, including the previously mentioned thumb screws 17, is secured to an upturned portion at the rear of floor member 19. Rear panel 23 is adapted to face outwardly of main enclosure 3 when card cage 11 is installed in computer 1. A portion of floor member 19 along the side of card cage 11 is upturned to form a riser card bracket 25, the purpose of which will become apparent with reference to FIG. 5. A pair of rails 27 extend from front wall or panel 21 to rear wall or panel 23 at the sides of card cage 11 to provide reinforcement. A holddown bracket 29 is secured to rails 27 by a pair of thumb screws 31, and serves to retain accessory circuit boards within card cage 11, as is described with reference to FIG. 5, below.

A plurality of standoffs 33 are provided on floor member 19 to provide a means for securing the planar circuit board within card cage 11. A plurality of expansion card slots and covers 35 are provided in rear panel 23 of card cage 11 and serve to provide a means for connecting accessory circuit boards installed in card cage 11 to components external of computer 1. A plurality of card guide members 37 are provided in front panel 21 of card cage 11 and serve to physically locate and facilitate installation and removal of accessory circuit boards.

A pair of rails 39 are secured to the underside of floor member 19 for sliding engagement with grooves 41 (illustrated in FIG. 3) in the base member of main enclosure 3. The dovetail configuration of rails 39 and grooves 41 aids in securing card cage 11 securely within main enclosure 3. It may be preferable to provide a similar rail 39 on one of rails 27 extending from front panel 21 to rear panel 23 at the sides of card cage 11 to engage a groove 41 on one wall of main enclosure 3 to further secure card cage 11 within computer 1. Because a plurality of grooves 41 are provided in the base member and upstanding walls of main enclosure 3, card cage 11 may be repositioned within main enclosure 3 as space requirements and modifications dictate. Of course, a rear panel different from that illustrated as 13 in FIGS. 2 and 3 would need to be provided to accommodate such a reconfiguration. A fastener 43, in the form of a spring-loaded T-handle, is provided on front panel 21 of card cage 11 to engage with a mating aperture in the base member of main enclosure 3 to further secure card cage 11 against inadvertent removal from main enclosure 3.

Figure 5:
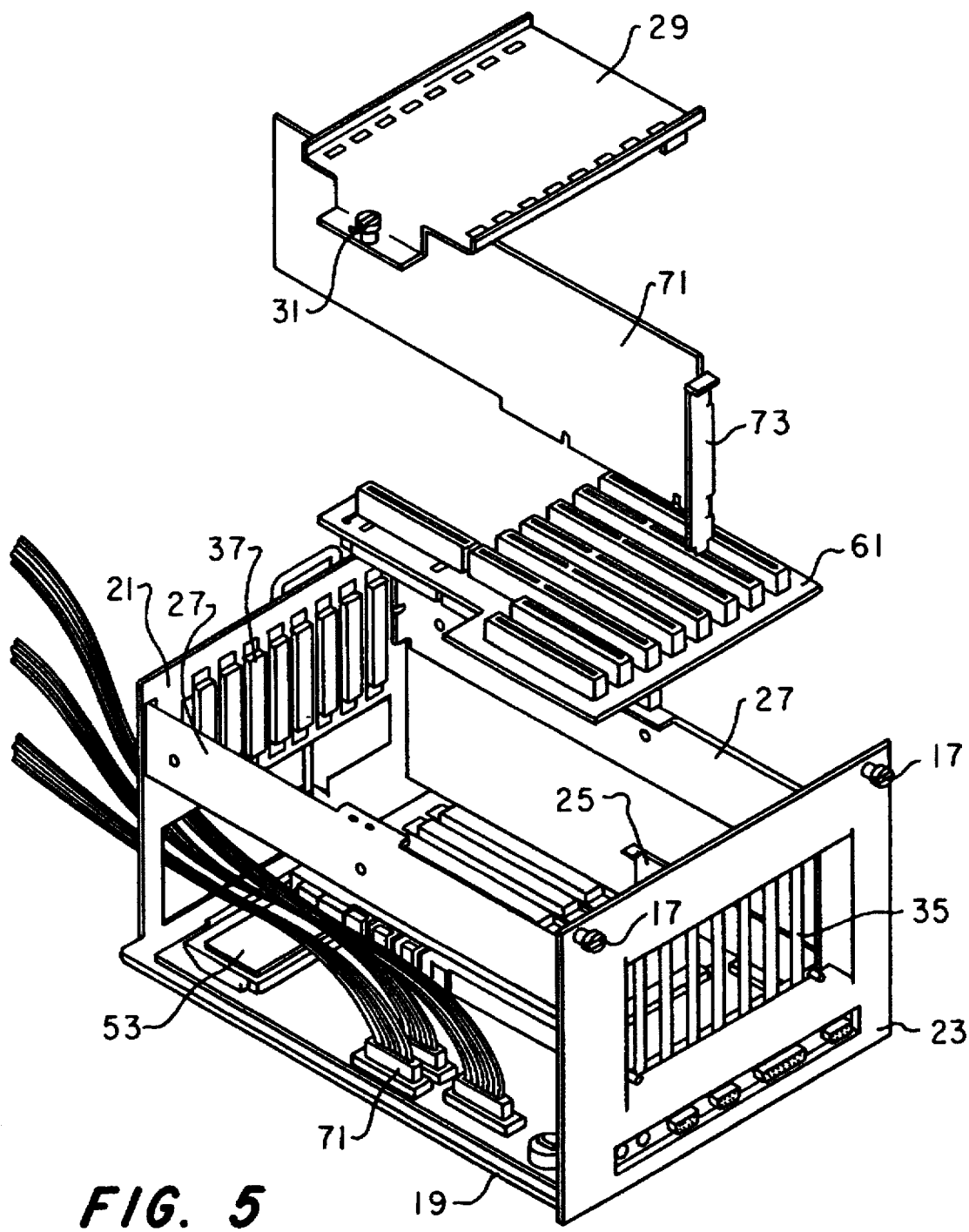
FIG. 5 is a rear, isometric exploded view of the card cage or subenclosure of FIG. 4 illustrating computer components disposed in the card cage.

FIG. 5 is a rear, exploded isometric view of card cage 11 that illustrates a preferred arrangement of circuit boards therein. A planar circuit board 51 is mounted with screws to standoffs (33 in FIG. 4) on floor member 19 of card cage 11. Planar circuit board 51 is commonly known as a motherboard and includes a central processing unit (CPU) 53. Planar circuit board 51 represents the heart of the modern computer in that it contains the electronic devices essential to the operation of a computer, i.e. CPU 53, read-only memory (ROM), random access memory (RAM), and other devices essential to the operation of the computer, but not including input means, display means, storage means, or other devices, which are located elsewhere in main enclosure 3 or external to computer 1 entirely. Planar circuit board 51 is electrically and mechanically connected by one or more ribbon cables 71 to other portions of computer 1, such as display panel 5, input means 7, and power supply 15, which are external of card cage 11.

A riser card 61 is mechanically and electrically connected to planar circuit board 51 and to riser card bracket 25 of card cage 11. Riser card 61 serves as the means electrically and mechanically connecting accessory cards to planar circuit board 51. According to a preferred embodiment of the present invention, planar circuit board 51 is mounted horizontally within card cage 11 and riser card 61 provides a plurality of connection means for vertically mounting accessory circuit board 71 within card cage 11. As previously stated, card guide members 37 mechanically engage the ends of accessory circuit boards 71 to facilitate their installation and removal in card cage 11. Holddown bracket 29 and thumb screws 31 cooperate with rails 27 to secure accessory card 71 within card cage 11. Depending upon the particular accessory circuit board 71, an external connection means 73 is provided to electrically connect at least accessory circuit board 71 with components external to computer 1.

With reference to FIGS. 1–5, the operation of computer I and card cage 11 according to the present invention will be described. As a preliminary matter, planar circuit board 51, riser card 61, and any desired accessory boards 71 are assembled into card cage 11. Card cage 11 then is installed in main enclosure 3 of computer 1 through an appropriate opening in rear panel 13 of main enclosure 3. Rails 39 on card cage 11 engage grooves 41 formed in at least the base member of main enclosure 3 to guide and maintain card cage 11 in its proper position within main enclosure 3. When card cage 11 is in its proper position, T-handle fastener 43 engages an aperture in the base member of main enclosure 3 to secure card cage 11 against inadvertent removal. Card cage 11 is further secured in main enclosure 3 by engagement between thumb screws 17 on rear panel 23 of card cage 11 with mating threaded apertures in rear panel 13 of main enclosure 3.

At some point during the operational life of computer 1, it may become necessary to repair, replace, or upgrade one or more of planar circuit board 51 or accessory cards 71. When this becomes necessary, thumb screws 17 are disengaged from rear panel 13 of main enclosure I and T-handle fastener 43 is disengaged from the base member of main enclosure 3 and card cage 11, planar circuit board 51, and accessory boards 71 are removed from computer 1 as a unit. After the necessary repair, replacement, or upgrade is effected, the removal procedure is reversed and card cage 11 is reinstalled in main enclosure 3 of computer 1.

The computer and card cage according to the present invention provide a number of advantages. A principal advantage is that the construction of the computer is modular, placing components that are most likely to require repair, replacement, or upgrade together in a single enclosure or card cage that is easily removed from the main enclosure of the computer as a unit. This advantage results in increased flexibility of the computer system, as well as simplified repair, replacement, and upgrade procedures.

The invention has been described with reference to preferred embodiments. It is thus not limited, but is susceptible to variation and modification without departing from the scope and spirit of the invention.

What is claimed is:

1. An improved computer for utilization in industrial applications, said computer comprising:
    a main enclosure for housing a plurality of computer components;
    a subenclosure housing a planar circuit board, including a CPU means, the subenclosure being adapted to receive at least one accessory circuit board electrically connected to the planar circuit board, the subenclosure being removably secured within said main enclosure, wherein said subenclosure, planar circuit board, and accessory circuit board may be selectively removed from said main enclosure as a unit;
    means for securing said planar circuit board horizontally in said subenclosure;
    a riser circuit board horizontally overlying and electrically connected to said planar circuit board, said accessory circuit board being electrically connectable to said riser circuit board to extend vertically therefrom;
    connection means for releasably electrically connecting at least said planar circuit board to at least one of said computer components housed within said main enclosure; and
    a plurality of grooves formed in one of said main enclosure and said subenclosure, said grooves for releasable engagement with at least one rail carried by another of said main enclosure and said subenclosure, wherein said subenclosure is adapted to be repositioned within said main enclosure by engagement between said rail and a selected one of said grooves.

2. The improved computer according to claim 1 further comprising:
    fastener means to selectively restrain said rail from movement relative to said groove; and
    said grooves and rail are dovetail in configuration.

3. An improved computer for utilization in industrial applications, said computer comprising:
    a main enclosure including a substantially flat base member having a periphery and at least one upstanding wall extending from said periphery of said base member;
    a subenclosure removably disposed in said main enclosure and including a substantially flat floor member, and an upstanding rear wall extending from said floor member, said rear wall being adapted to face outwardly of said main enclosure;
    a planar circuit board, including a CPU means, disposed in said subenclosure and secured to at least said floor member;
    a riser circuit board horizontally overlying and electrically connected to said planar circuit board;
    at least one accessory circuit board disposed in said subenclosure and electrically connected to said planar circuit board said accessory circuit board being electrically connectable to said riser circuit board to extend vertically therefrom;
    connection means on said rear wall for electrically connecting at least said accessory circuit board to a device external of said main enclosure;
    a plurality of computer components disposed in said main enclosure externally of said subenclosure;
    means releasably securing said subenclosure within said main enclosure, wherein said subenclosure, planar circuit board, and accessory circuit board may be selectively removed from said main enclosure as a unit;
    subenclosure connection means for releasably electrically connecting at least said planar circuit board with at least one of said computer components in said main enclosure; and
    a plurality of grooves formed in one of said flat base member and said upstanding wall of said main enclosure and said subenclosure, said grooves for releasable engagement with at least one rail carried by another of said flat base member and said upstanding wall of said main enclosure and said subenclosure, wherein said subenclosure is adapted to be repositioned within said main enclosure by engagement between said rail and a selected one of said grooves.

4. The improved computer according to claim 3 further comprising:
    fastener means to selectively restrain said rail from movement relative to said groove; and
    said grooves and said rail being dovetail in configuration.

5. A card cage assembly for utilization in a computer enclosure containing a plurality of computer components, said card cage comprising:
    a substantially flat floor member;
    at least one upstanding wall;
    a planar circuit board, including a CPU, secured in said card cage;
    means for securing said planar circuit board horizontally onto said floor member of said subenclosure;
    a riser circuit board horizontally overlying and electrically connected to said planar circuit board; and
    at least one accessory circuit board within said card cage being electrically connectable to said riser circuit board to extend vertically therefrom;

card cage connection means for releasably electrically connecting at least said planar circuit board with a computer component external to said card cage; and external connection means carried by said upstanding wall of said card cage for electrically connecting said accessory circuit board with apparatus external to said computer enclosure; and means removably securing said card cage within said computer enclosure, wherein said card cage and planar circuit board are removable from said computer enclosure as a unit, said securing means comprising a plurality of grooves formed in one of said computer enclosure and said card cage, said grooves for releasable engagement with at least one rail carried by another of said computer enclosure and said card cage, wherein said card cage is adapted to be repositioned within said computer enclosure by engagement between said rail and a selected one of said grooves.

6. The card cage according to claim 5, wherein the means for removably securing said card cage in said computer enclosure further includes:

a fastening means to selectively prevent movement of said enclosure relative to said computer enclosure; and said rail and grooves are dovetail in configuration.

\* \* \* \* \*